United States Patent
Rao

(10) Patent No.: US 7,491,587 B2
(45) Date of Patent: *Feb. 17, 2009

(54) METHOD FOR MAKING A SEMICONDUCTOR DEVICE HAVING A SEMICONDUCTOR-ON-INSULATOR (SOI) CONFIGURATION AND INCLUDING A SUPERLATTICE ON A THIN SEMICONDUCTOR LAYER

(75) Inventor: Kalipatnam Vivek Rao, Grafton, MA (US)

(73) Assignee: Mears Technologies, Inc., Waltham, MA (US)

( * ) Notice: Subject to any disclaimer, the term of this patent is extended or adjusted under 35 U.S.C. 154(b) by 313 days.

This patent is subject to a terminal disclaimer.

(21) Appl. No.: 11/428,003

(22) Filed: Jun. 30, 2006

(65) Prior Publication Data
US 2006/0292818 A1  Dec. 28, 2006

Related U.S. Application Data

(63) Continuation-in-part of application No. 11/381,835, filed on May 5, 2006, and a continuation-in-part of application No. 11/089,950, filed on Mar. 25, 2005, now Pat. No. 7,303,948, which is a continuation of application No. 10/647,069, filed on Aug. 22, 2003, now Pat. No. 6,897,472, which is a continuation-in-part of application No. 10/603,696, filed on Jun. 26, 2003, now abandoned, and a continuation-in-part of application No. 10/603,621, filed on Jun. 26, 2003, now abandoned.

(60) Provisional application No. 60/695,588, filed on Jun. 30, 2005.

(51) Int. Cl.
*H01L 21/84* (2006.01)

(52) U.S. Cl. .................. 438/149; 257/E21.32
(58) Field of Classification Search ................. 438/149; 257/E21.016, E21.32
See application file for complete search history.

(56) References Cited

U.S. PATENT DOCUMENTS 4,485,128 A  11/1984  Dalal et al. ............... 427/85

(Continued)

FOREIGN PATENT DOCUMENTS

EP  0 843 361  5/1998

(Continued)

OTHER PUBLICATIONS

"Structure of MBE Grwon Semiconductor-atomic Superlattices", Tsu et al., Journal of Crystal Growth, Elsevier, Amsterdam, NL, vol. 227-228, Jul. 2001, pp. 21-26, XP004250792, ISSN: 0022-0248.

(Continued)

*Primary Examiner*—W. David Coleman
(74) *Attorney, Agent, or Firm*—Allen, Dyer, Doppelt, Milbrath & Gilchrist, P.A.

(57) ABSTRACT

A method for making a semiconductor device may include forming an insulating layer on a substrate, and forming a semiconductor layer on the insulating layer on a side thereof opposite the substrate. The method may further include forming a superlattice on the semiconductor layer on a side thereof opposite the insulating layer. The superlattice may include a plurality of stacked groups of layers, with each group comprising a plurality of stacked base semiconductor monolayers defining a base semiconductor portion and at least one non-semiconductor monolayer thereon. Moreover, the at least one non-semiconductor monolayer may be constrained within a crystal lattice of adjacent base semiconductor portions.

21 Claims, 9 Drawing Sheets

U.S. PATENT DOCUMENTS

| | | | |
|---|---|---|---|
| 4,594,603 A | 6/1986 | Holonyak, Jr. | 357/16 |
| 4,882,609 A | 11/1989 | Schubert et al. | 357/22 |
| 4,908,678 A | 3/1990 | Yamazaki | 357/4 |
| 4,937,204 A | 6/1990 | Ishibashi et al. | 437/110 |
| 4,969,031 A | 11/1990 | Kobayashi et al. | 357/63 |
| 5,055,887 A | 10/1991 | Yamazaki | 357/4 |
| 5,081,513 A | 1/1992 | Jackson et al. | 357/23.7 |
| 5,216,262 A | 6/1993 | Tsu | 257/17 |
| 5,357,119 A | 10/1994 | Wang et al. | 257/18 |
| 5,577,061 A | 11/1996 | Hasenberg et al. | 372/45 |
| 5,594,567 A | 1/1997 | Akiyama et al. | 349/28 |
| 5,606,177 A | 2/1997 | Wallace et al. | 257/25 |
| 5,616,515 A | 4/1997 | Okuno | 438/478 |
| 5,627,386 A | 5/1997 | Harvey et al. | 257/79 |
| 5,683,934 A | 11/1997 | Candelaria | 437/134 |
| 5,684,817 A | 11/1997 | Houdre et al. | 372/45 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B2 | 10/2002 | Takagi | 257/77 |
| 6,498,359 B2 | 12/2002 | Schmidt et al. | 257/190 |
| 6,501,092 B1 | 12/2002 | Nikonov et al. | 257/29 |
| 6,521,519 B2 | 2/2003 | Shimizu et al. | 438/786 |
| 6,566,679 B2 | 5/2003 | Nikonov et al. | 257/29 |
| 6,608,327 B1 | 8/2003 | Davis et al. | 257/76 |
| 6,621,097 B2 | 9/2003 | Nikonov et al. | 257/17 |
| 6,638,838 B1 | 10/2003 | Eisenbeiser et al. | 438/481 |
| 6,646,293 B2 | 11/2003 | Emrick et al. | 257/194 |
| 6,673,646 B2 | 1/2004 | Droopad | 438/85 |
| 6,690,699 B2 | 2/2004 | Capasso et al. | 372/44 |
| 6,711,191 B1 | 3/2004 | Kozaki et al. | 372/43 |
| 6,748,002 B2 | 6/2004 | Shveykin | 372/45 |
| 6,816,530 B2 | 11/2004 | Capasso et al. | 372/50 |
| 2002/0094003 A1 | 7/2002 | Bour et al. | 372/46 |
| 2003/0034529 A1 | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0162335 A1 | 8/2003 | Yuki et al. | 438/151 |
| 2003/0215990 A1 | 11/2003 | Fitzgerald et al. | 438/172 |
| 2004/0084781 A1 | 5/2004 | Ahn et al. | 257/777 |
| 2004/0227165 A1 | 11/2004 | Wang et al. | 257/222 |
| 2004/0266045 A1 | 12/2004 | Mears et al. | 438/47 |
| 2005/0110003 A1 | 5/2005 | Kreps | 257/24 |
| 2006/0243964 A1* | 11/2006 | Kreps et al. | 257/28 |

FOREIGN PATENT DOCUMENTS

| | | |
|---|---|---|
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |
| WO | WO2005/034245 | 4/2005 |

OTHER PUBLICATIONS

"Transport through a Nine Period Silicon/Oxygen Superlattice", Seo et al., Applied Physics Letters, AIP, American Institute of Physics, Melville, NY, US, vol. 79, No. 6, Aug. 6, 2001, pp. 788-790, XP012029987, ISSN: 0003-6951.

Luo et al., *Chemical Design of Direct-Gap Light-Emitting Silicon*, published Jul. 25, 2002, The American Physical Society; vol. 89, No. 7.

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors* (n>2.0) *in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

* cited by examiner

METHOD FOR MAKING A SEMICONDUCTOR DEVICE HAVING A SEMICONDUCTOR-ON-INSULATOR (SOI) CONFIGURATION AND INCLUDING A SUPERLATTICE ON A THIN SEMICONDUCTOR LAYER

CROSS-REFERENCE TO RELATED APPLICATIONS

This application claims the benefit of U.S. Provisional Application No. 60/695,588, filed Jun. 30, 2005, and is a continuation-in-part of U.S. patent application Ser. No. 11/381,835 filed May 5, 2006, a continuation-in-part of U.S. patent application Ser. No. 11/089,950, filed Mar. 25, 2005, now U.S. Pat. No. 7,303,948, which is a continuation of U.S. patent application Ser. No. 10/647,069 filed Aug. 22, 2003, now U.S. Pat. No. 6,897,472, which in turn is a continuation-in-part of U.S. patent application Ser. Nos. 10/603,696 now abandoned and 10/603,621 now abandoned, both filed on Jun. 26, 2003, the entire disclosures of which are hereby incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2/Si$ with a thickness generally in a range of two to six monolayers. A much thicker section of silicon is sandwiched between the barriers An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller device features.

SUMMARY OF THE INVENTION

In view of the foregoing background, it is therefore an object of the present invention to provide a method for making a semiconductor device, such as a silicon-on-insulator (SOI) device, having relatively high charge carrier mobility and related methods.

This and other objects, features, and advantages in accordance with the present invention are provided by a method for making a semiconductor device which may include forming an insulating layer on a substrate, and forming a semiconductor layer on the insulating layer on a side thereof opposite the substrate. The method may further include forming a superlattice on the semiconductor layer on a side thereof opposite the insulating layer. More particularly, the superlattice may include a plurality of stacked groups of layers, with each group comprising a plurality of stacked base semiconductor monolayers defining a base semiconductor portion and at least one non-semiconductor monolayer thereon. Moreover, the at least one non-semiconductor monolayer may be constrained within a crystal lattice of adjacent base semiconductor portions.

The semiconductor layer and the base semiconductor monolayers may each comprise a same semiconductor material. By way of example, the substrate, the semiconductor layer, and the base semiconductor monolayers may each comprise silicon, and the insulating layer may comprise silicon oxide. Also, the semiconductor layer may have a thickness of less than about 10 nm, for example. The method may further include forming spaced-apart source and drain regions laterally adjacent the superlattice to define a channel therein, and forming a gate overlying the superlattice. In addition, a contact layer may be formed on at least one of the source and drain regions.

With respect to the superlattice, each non-semiconductor layer may be a single monolayer thick. Furthermore, each base semiconductor portion may be less than eight monolayers thick. The superlattice may further include a base semiconductor cap layer on an uppermost group of layers. In some embodiments, all of the base semiconductor portions may be a same number of monolayers thick. Alternatively, at least some of the base semiconductor portions may be a different number of monolayers thick, or all of the base semiconductor portions may be a different number of monolayers thick.

Each base semiconductor portion may include a base semiconductor selected from the group consisting of Group IV semiconductors, Group III-V semiconductors, and Group II-VI semiconductors. In addition, each non-semiconductor monolayer may include a non-semiconductor selected from the group consisting of oxygen, nitrogen, fluorine, and carbon-oxygen. Further, opposing base semiconductor portions in adjacent groups of layers may be chemically bound together.

DETAILED DESCRIPTION OF THE PREFERRED EMBODIMENTS

Figure 1:
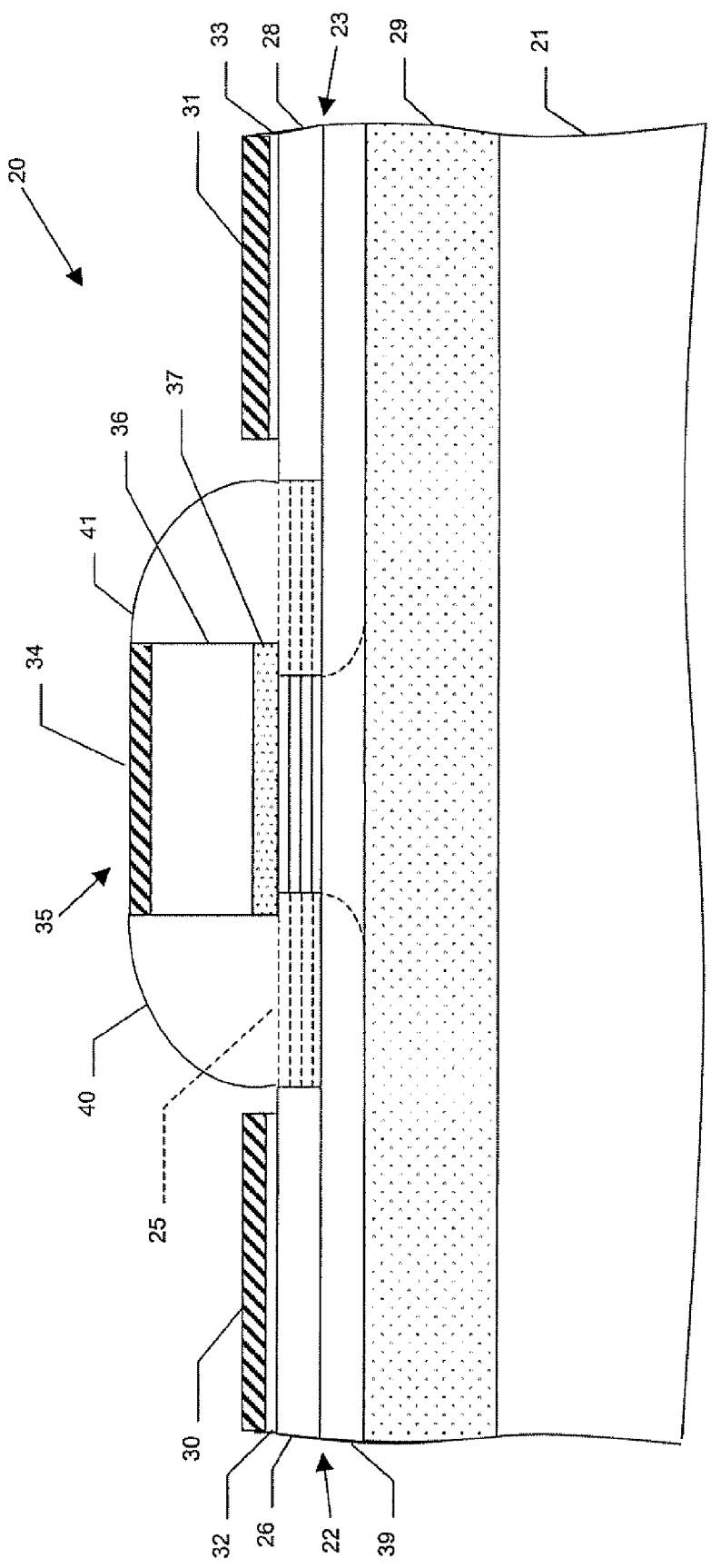
FIG. 1 is schematic cross-sectional view of a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments. Also, the size of regions or thicknesses of various layers may be exaggerated in certain views for clarity of illustration.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{BZ} f(E(k,n), E_F, T) d^3k}$$

for electrons and:

$$M_{h,ij}^{-1}(E_F, T) =$$

$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{BZ} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a superlattice 25 material for a channel region in a semiconductor device. A silicon-on-insulator (SOI) MOSFET 20 including the superlattice 25 in accordance with the invention is now first described with reference to FIG. 1. One skilled in the art, however, will appreciate that the materials identified herein could be used in many different types of semiconductor devices, such as discrete devices and/or integrated circuits.

The illustrated SOI MOSFET 20 includes a silicon substrate 21, an insulating layer (e.g., silicon oxide on a high-K dielectric) 29 on the substrate, and a semiconductor (i.e., silicon) layer 39 on a face of the insulating layer opposite the substrate. By way of example, the semiconductor layer 39 may be a relatively thin monocrystalline silicon layer having a thickness of less than about 10 nm, and, more preferably, about 5 nm. The layer 39 advantageously acts as a "substrate" for the formation of the superlattice 25, as will be described further below. Since the underlying insulating layer 29 is amorphous (i.e., lacks crystallinity), Applicant theorizes without wishing to be bound thereto that the insulating layer will act as a shock absorber and provide relatively stress-free conditions during growth of an Si—O superlattice, for example. Of course, other materials and layer thicknesses may be used in different embodiments.

Spaced-apart source and drain regions 22, 23 are laterally adjacent the superlattice 25 as shown and define a channel of the MOSTFET 20 therein. In the illustrated example, the source and drain regions 22, 23 include respective epitaxial silicon layers 26, 28 formed on the semiconductor layer 39 which are doped to the desired concentration. Moreover, the dopant may permeate portions of the superlattice 25, which are shown with dashes in the illustrated embodiment for clarity of illustration. Of course, the remaining portion of the superlattice 25 (i.e., the portion not shown with dashes) may also be doped with a channel implant dopant in some embodiments, for example.

The MOSEFT 20 also illustratively includes a gate 35 comprising a gate insulating (e.g., oxide) layer 37 on the superlattice 25 and a gate electrode layer 36 on the gate insulating layer. Sidewall spacers 40, 41 are also provided in the illustrated SOI MOSFET 20, as well as a silicide layer 34 on the gate electrode layer 36. Source/drain silicide layers 30, 31 and source/drain contacts 32, 33 overlie the source/drain regions 22, 23, as will be appreciated by those skilled in the art. For clarity of illustration, the dielectric layer 37 and the insulating layer 29 are shown with stippling in the drawings.

Further details regarding the above-described raised source/drain configuration may be found in a co-pending application entitled SEMICONDUCTOR DEVICE COMPRISING A SUPERLATTICE WITH UPPER PORTIONS EXTENDING ABOVE ADJACENT UPPER PORTIONS OF SOURCE AND DRAIN REGIONS, U.S. patent application Ser. No. 10/941,062, which is hereby incorporated herein in its entirety by reference However, it should be noted that other source/drain and gate configurations may be also used in some embodiments.

As will be appreciated by those skilled in the art, the insulating layer 29 of the above-described SOI device advantageously provides reduced capacitance adjacent the source and drain regions 22, 23, thereby reducing switching time and providing faster device operation, for example. It should be noted that other materials may be used for the insulating layer 29, such as glass or sapphire, for example. Moreover, the substrate 21 and semiconductor layer 39 may comprise other semiconductor materials, such as germanium, for example.

Applicants have identified improved materials or structures for the channel region of the SOI MOSFET 20. More specifically, the Applicants have identified materials or structures having energy band structures for which the appropriate conductivity effective masses for electrons and/or holes are substantially less than the corresponding values for silicon.

Figure 2:
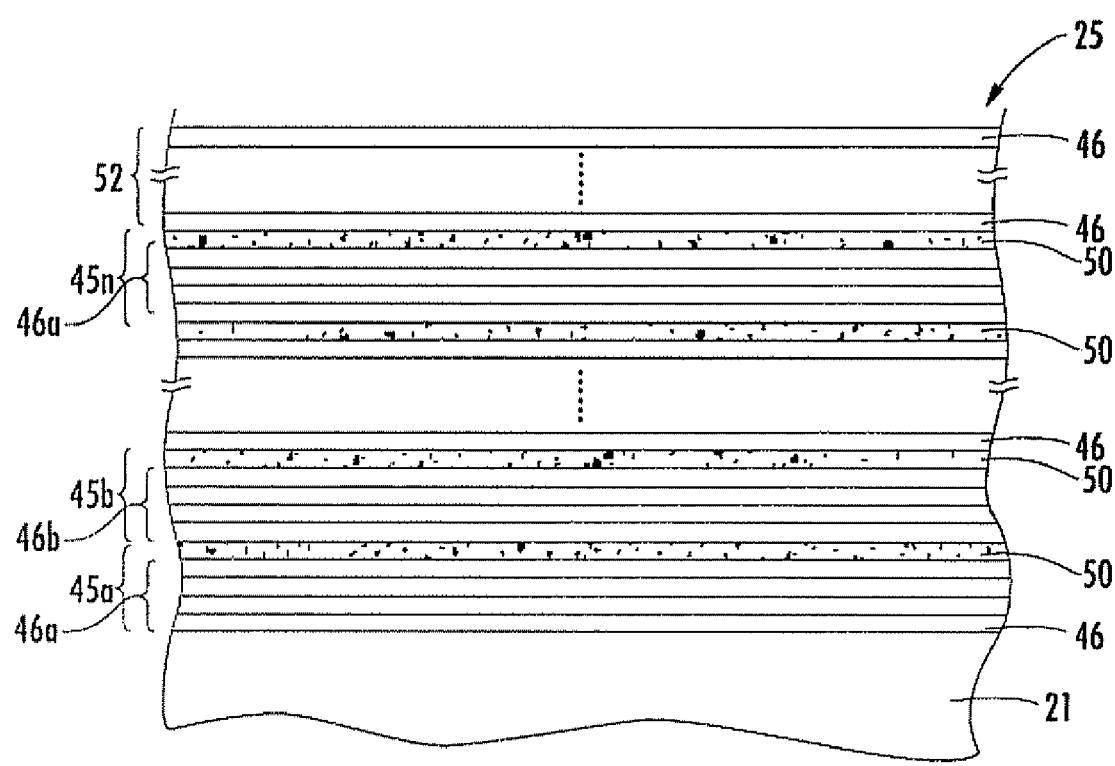
FIG. 2 is a greatly enlarged schematic cross-sectional view of the superlattice as shown in FIG. 1.
Figure 3:
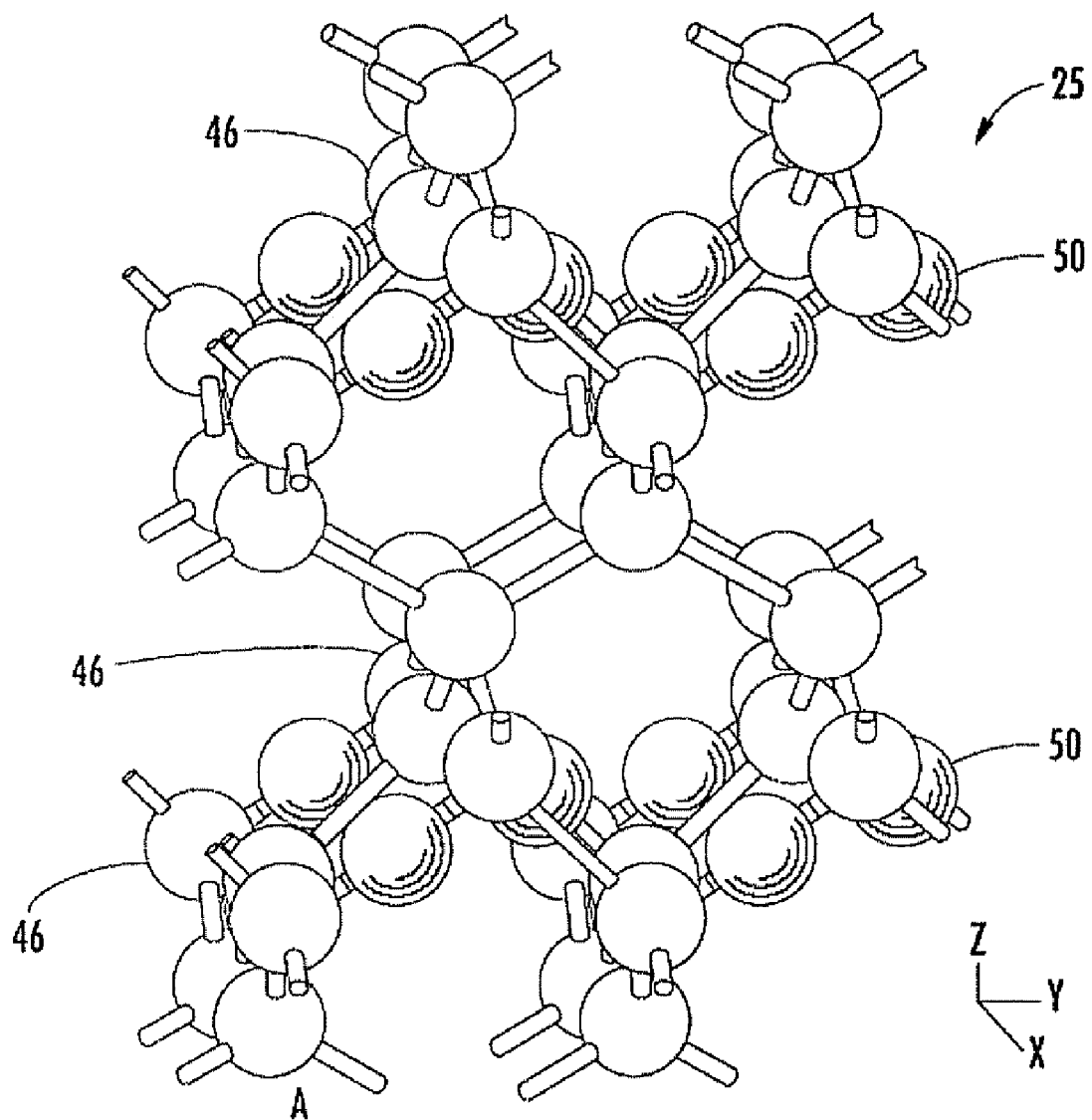
FIG. 3 is a perspective schematic atomic diagram of a portion of the superlattice shown in FIG. 1.

Referring now additionally to FIGS. 2 and 3, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 2.

Each group of layers 45a-45n of the superlattice 25 illustratively includes a plurality of stacked base semiconductor monolayers 46 defining a respective base semiconductor portion 46a-46n and an energy band-modifying layer 50 thereon The energy band-modifying layers 50 are indicated by stippling in FIG. 2 for clarity of illustration.

The energy-band modifying layer 50 illustratively includes one non-semiconductor monolayer constrained within a crystal lattice of adjacent base semiconductor portions In other embodiments, more than one such monolayer may be possible It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure.

It is also theorized that the semiconductor device described above enjoys a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example, as described in further detail below.

As will be appreciated by those skilled in the art, the source/drain regions 22, 23 and gate 35 of the MOSFET 20 may be considered as regions for causing the transport of charge carriers through the superlattice in a parallel direction relative to the layers of the stacked groups 45a-45n, Other such regions are also contemplated by the present invention.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 2 and 3, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes Of course, the superlattice 25 may further comprise at least one type of conductivity dopant therein as will also be appreciated by those skilled in the art.

Figure 4:
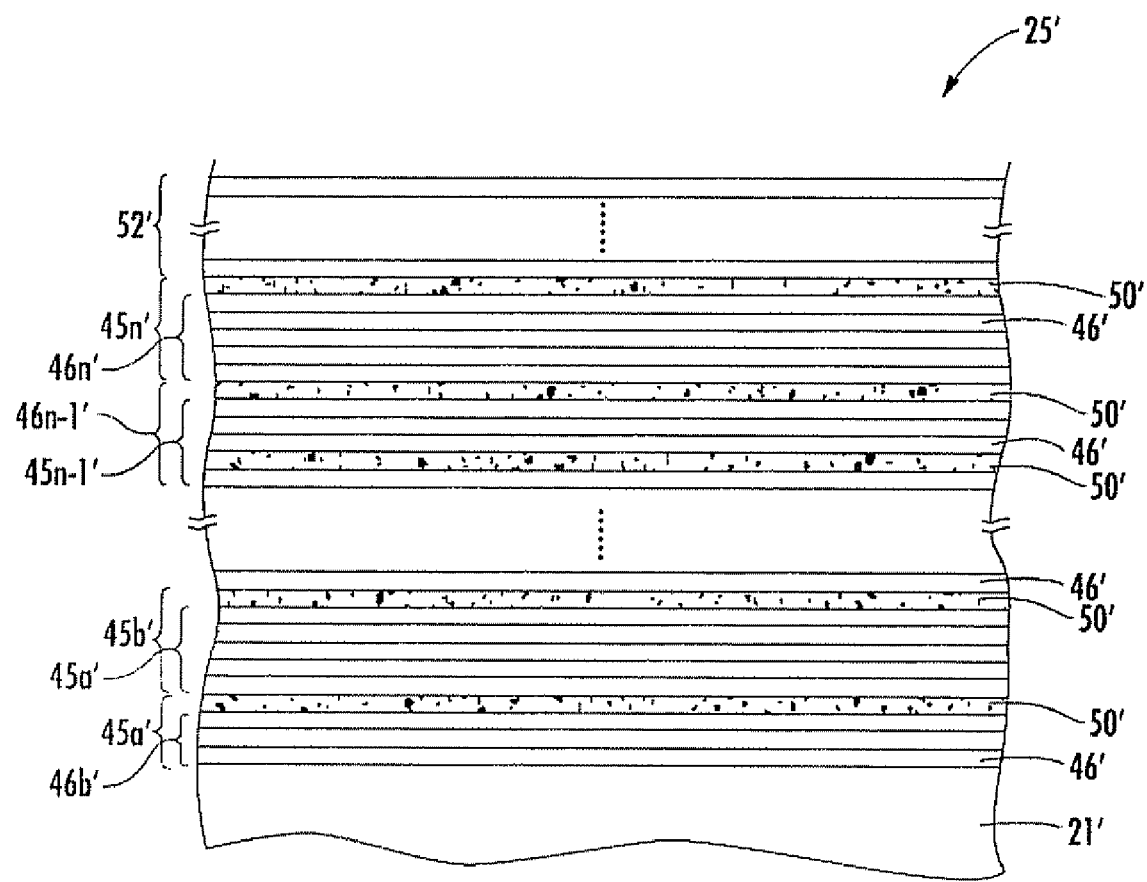
FIG. 4 is a greatly enlarged schematic cross-sectional view of another embodiment of a superlattice that may be used in the device of FIG. 1.

Indeed, referring now additionally to FIG. 4, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 4 not specifically mentioned are similar to those discussed above with reference to FIG. 2 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 5A:
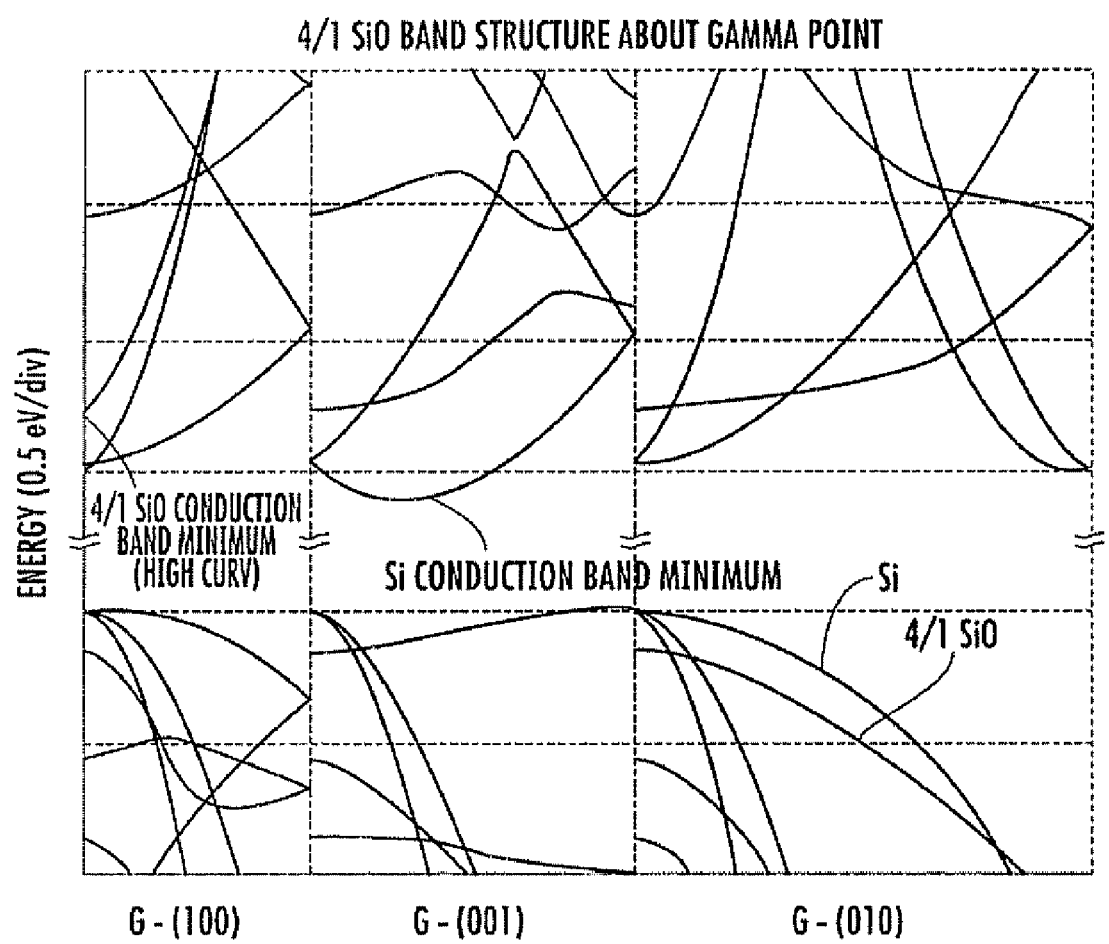
FIG. 5A is a graph of the calculated band structure from the gamma point (G) for both bulk silicon as in the prior art, and for the 4/1 Si/O superlattice as shown in FIGS. 1-3.
Figure 5B:
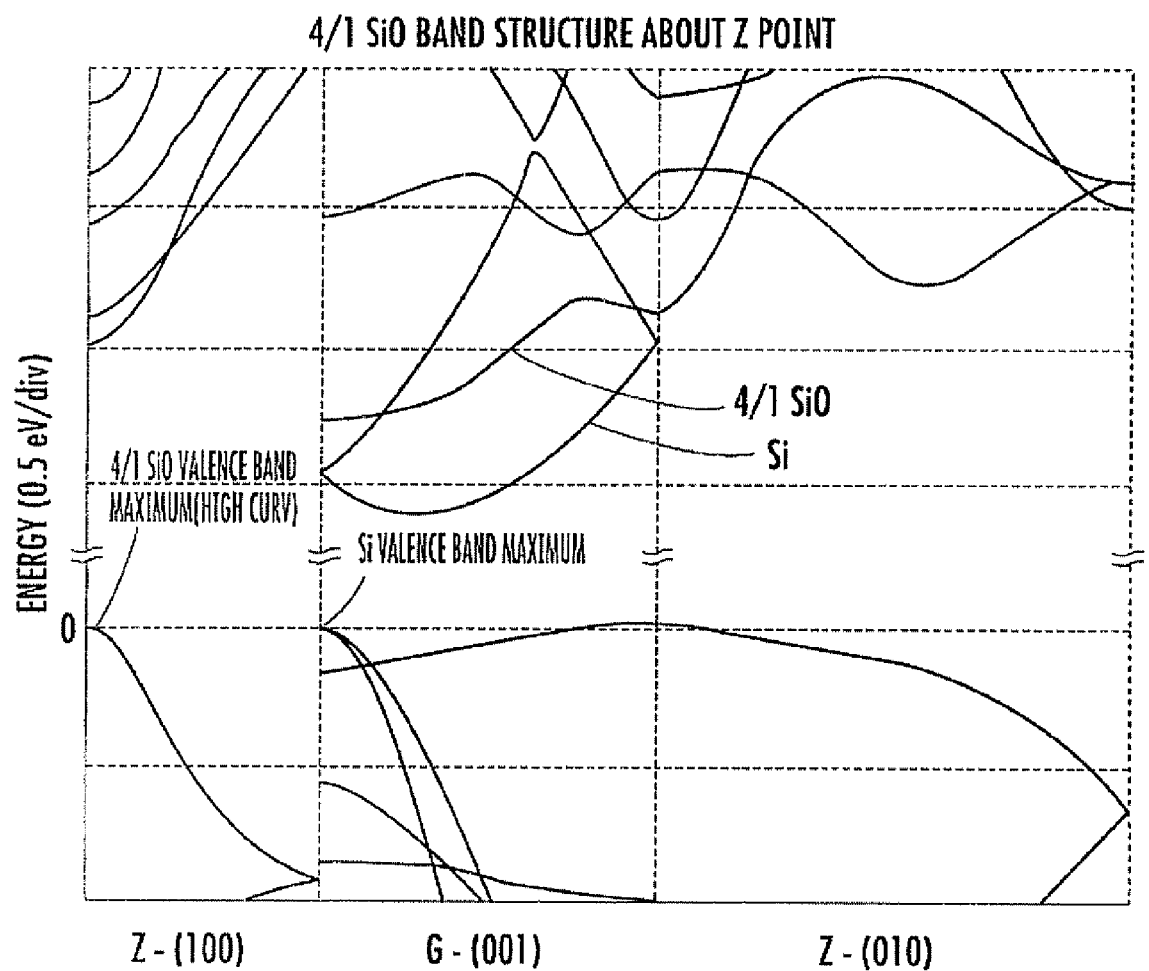
FIG. 5B is a graph of the calculated band structure from the Z point for both bulk silicon as in the prior art, and for the 4/1 Si/O superlattice as shown in FIGS. 1-3.
Figure 5C:
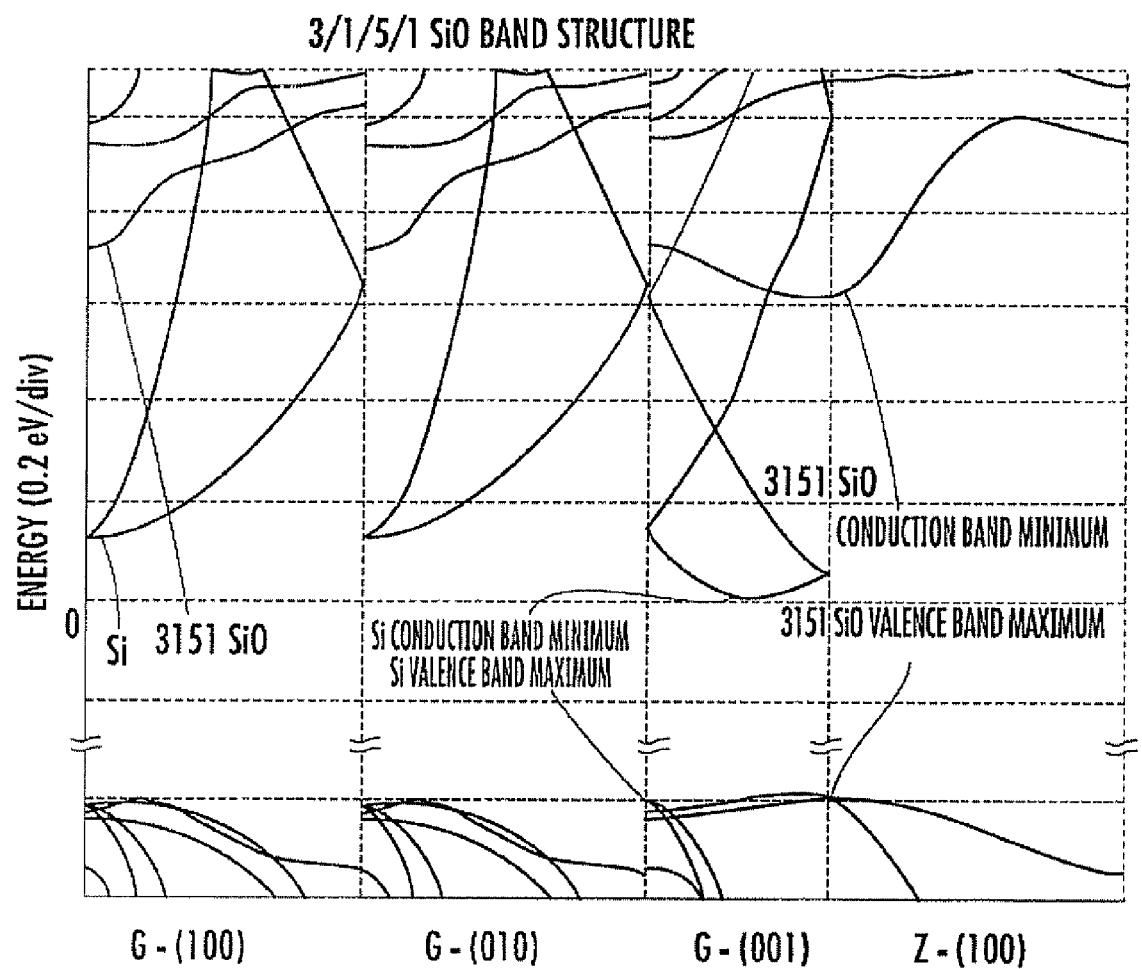
FIG. 5C is a graph of the calculated band structure from both the gamma and Z points for both bulk silicon as in the prior art, and for the 5/1/3/1 Si/O superlattice as shown in FIG. 4.

In FIGS. 5A-5C band structures calculated using Density Functional Theory (DFT) are presented. It is well known in the art that DFT underestimates the absolute value of the bandgap. Hence all bands above the gap may be shifted by an appropriate "scissors correction". However the shape of the band is known to be much more reliable. The vertical energy axes should be interpreted in this light.

FIG. 5A shows the calculated band structure from the gamma point (G) for both bulk silicon (represented by continuous lines) and for the 4/1 Si/O superlattice 25 as shown in FIGS. 1-3 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 5B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 5C shows the calculated band structure from both the gamma and Z point for both bulk silicon (continuous lines) and for the 5/1/3/1 Si/O structure of the superlattice 25' of FIG. 4 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will he understood by those skilled in the art, the appropriate matrix element for optical transition is another indicator of the distinction between direct and indirect bandgap behavior.

Figure 6A:
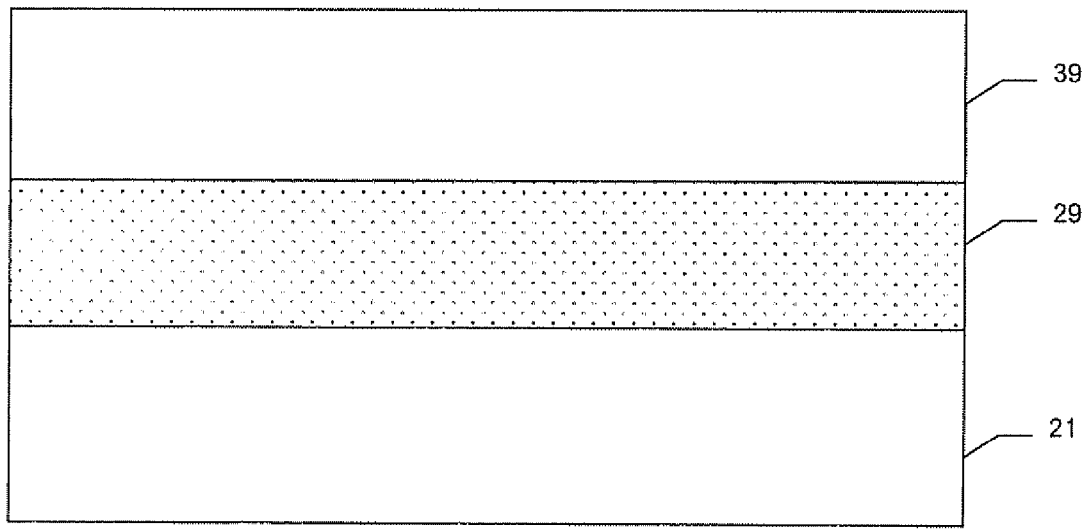
FIGS. 6A-6C are a series of schematic cross-sectional diagrams illustrating a method for making the semiconductor device of FIG. 1.
Figure 6B:
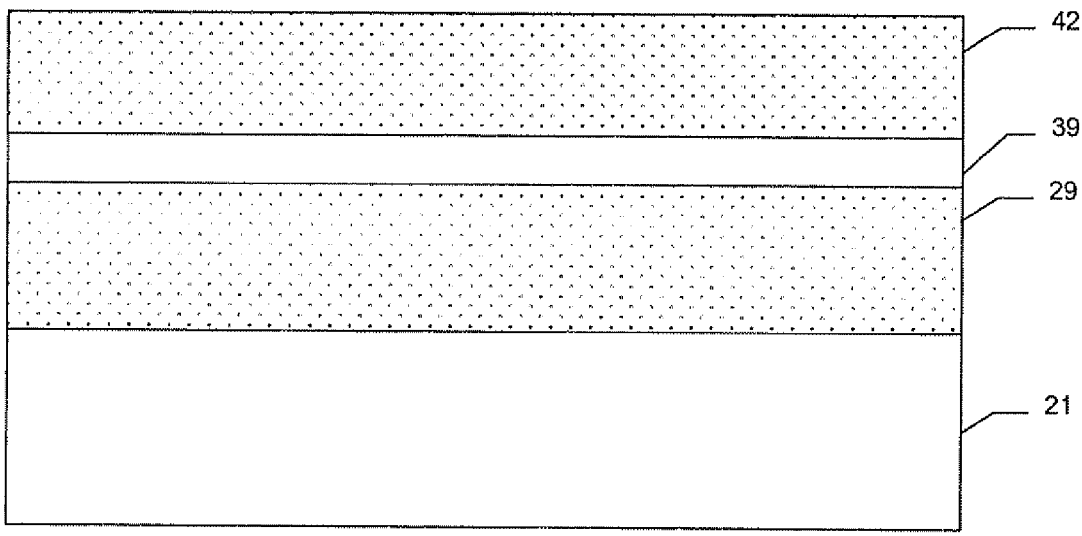
Figure 6C:
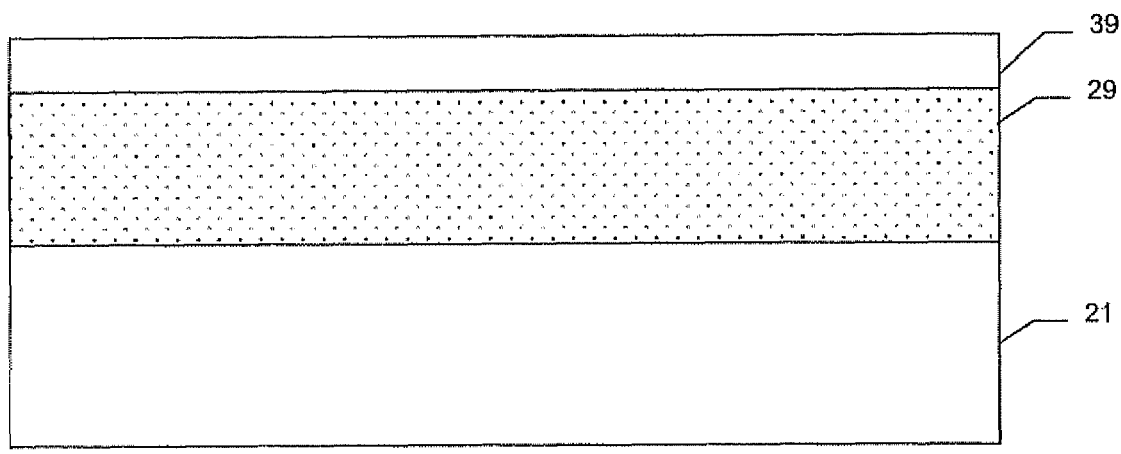

Referring additionally to FIGS. 6A-6C, a method for making the SOI MOSFET 20 will now be described. The method begins with providing a semiconductor (e.g., silicon) substrate 21 with the insulating layer 29 and semiconductor layer 39 thereon (FIG. 6A). As will be appreciated by those skilled in the art, SOI wafers are commercially available with about a 100-200 nm silicon film on the insulating layer 29.

Next, a controlled thermal oxidation is performed to form an oxidized layer 42 (FIG. 6B), followed by a wet HF stripping of the oxidized layer to leave a relatively thin portion of the silicon layer 39 having a thickness of less than about 10 nm and, more preferably, about 5 nm (FIG. 6C). Thereafter, the superlattice 25 may be formed on the thin silicon layer 39, as discussed above, followed by the remaining source/drain and gate structures, as will be appreciated by those skilled in the art.

It should be noted that devices other than MOSFETs may be produced in accordance with the present invention. By way of example, one type of insulator-on-substrate device that may be produced using the above described techniques is a memory device, such as the one described in a co-pending application entitled SEMICONDUCTOR DEVICE INCLUDING A FLOATING GATE MEMORY CELL WITH A SUPERLATTICE CHANNEL, U.S. patent application Ser. No. 11/381,787, which is assigned to the present Assignee and is hereby incorporated herein in its entirety by reference. Other potential insulator-on-substrate devices include optical devices, such as those disclosed in U.S. patent application Ser. No. 10/936,903, which is also assigned to the present Assignee and is hereby incorporated herein in its entirety by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
   forming an insulating layer on a substrate;
   forming a semiconductor layer on the insulating layer on a side thereof opposite the substrate; and
   forming a superlattice on the semiconductor layer on a side thereof opposite the insulating layer;
   the superlattice comprising a plurality of stacked groups of layers with each group comprising a plurality of stacked base semiconductor monolayers defining a base semiconductor portion and at least one non-semiconductor monolayer thereon, and with the at least one non-semiconductor monolayer being constrained within a crystal lattice of adjacent base semiconductor portions.

2. The method of claim 1 wherein the semiconductor layer and the base semiconductor monolayers each comprises a same semiconductor material.

3. The method of claim 1 wherein the substrate, the semiconductor layer and the base semiconductor monolayers each comprises silicon; and wherein the insulating layer comprises silicon oxide.

4. The method of claim 1 wherein the semiconductor layer has a thickness of less than about 10 nm.

5. The method of claim 1 further comprising:
   forming spaced-apart source and drain regions laterally adjacent the superlattice to define a channel therein;
   forming a gate dielectric layer overlying the superlattice; and
   a gate electrode layer overlying said gate dielectric layer.

6. The method of claim 1 wherein each non-semiconductor layer is a single monolayer thick.

7. The method of claim 1 wherein each base semiconductor portion is less than eight monolayers thick.

8. The method of claim 1 wherein the superlattice further comprises a base semiconductor cap layer on an uppermost group of layers.

9. The method of claim 1 wherein all of the base semiconductor portions are a same number of monolayers thick.

10. The method of claim 1 wherein at least some of the base semiconductor portions are a different number of monolayers thick.

11. The method of claim 1 wherein all of the base semiconductor portions are a different number of monolayers thick.

12. The method of claim 1 wherein each base semiconductor portion comprises a base semiconductor selected from the group consisting of Group IV semiconductors, Group III-V semiconductors, and Group II-VI semiconductors.

13. The method of claim 1 wherein each non-semiconductor monolayer comprises a non-semiconductor selected from the group consisting of oxygen, nitrogen, fluorine, and carbon-oxygen.

14. The method of claim 1 wherein opposing base semiconductor portions in adjacent groups of layers are chemically bound together.

15. The method of claim 5 further comprising forming a contact layer on at least one of the source and drain regions.

16. A method for making a semiconductor device comprising:
   forming an insulating layer on a substrate;
   forming a semiconductor layer on the insulating layer on a side thereof opposite the substrate, the semiconductor layer having a thickness of less than about 10 nm; and
   forming a superlattice on the semiconductor layer on a side thereof opposite the insulating layer;
   the superlattice comprising a plurality of stacked groups of layers with each group comprising a plurality of stacked base semiconductor monolayers defining a base semiconductor portion and at least one non-semiconductor monolayer thereon, and with the at least one non-semiconductor monolayer being constrained within a crystal lattice of adjacent base semiconductor portions;
   the semiconductor layer and the base semiconductor monolayers each comprising a same semiconductor material.

17. The method of claim 16 wherein the substrate, the semiconductor layer and the base semiconductor monolayers each comprises silicon; and wherein the insulating layer comprises silicon oxide.

18. The method of claim 16 further comprising:

forming spaced-apart source and drain regions laterally adjacent the superlattice to define a channel therein;

forming a gate dielectric layer overlying the superlattice; and a gate electrode layer overlying said gate dielectric layer.

19. The method of claim 16 wherein each base semiconductor portion comprises a base semiconductor selected from the group consisting of Group IV semiconductors, Group III-V semiconductors, and Group II-VI semiconductors.

20. The method of claim 16 wherein each non-semiconductor monolayer comprises a non-semiconductor selected from the group consisting of oxygen, nitrogen, fluorine, and carbon-oxygen.

21. The method of claim 16 wherein opposing base semiconductor portions in adjacent groups of layers are chemically bound together.

* * * * *

UNITED STATES PATENT AND TRADEMARK OFFICE
CERTIFICATE OF CORRECTION

PATENT NO.         : 7,491,587 B2                                      Page 1 of 1
APPLICATION NO.    : 11/428003
DATED              : February 17, 2009
INVENTOR(S)        : Roa It is certified that error appears in the above-identified patent and that said Letters Patent is hereby corrected as shown below:

Title Pg, Item (56)            Delete: "6,521,519 B2  2/2003   Shimizu et al."
Ref. Cited, Page 2             Insert: --6,521,519 B2  2/2003   Kamath et al.--

Column 5, Line 34              Delete: "MOSTFET"
                               Insert: --MOSFET--

Column 5, Line 44              Delete: "MOSEFT"
                               Insert: --MOSFET--

Column 6, Line 26              Delete: "energy-band modifying"
                               Insert: --energy band-modifying--

Signed and Sealed this

Ninth Day of June, 2009

JOHN DOLL
*Acting Director of the United States Patent and Trademark Office*